US006726767B1

(12) United States Patent
Marrs et al.

(10) Patent No.: US 6,726,767 B1
(45) Date of Patent: Apr. 27, 2004

(54) LAYER PROCESSING

(75) Inventors: Alan D Marrs, Malvern (GB); Allister W. E. Dann, Malvern (GB); John L Glasper, Malvern (GB); Christopher Pickering, Malvern (GB); David J Robbins, Malvern (GB); John Russell, Malvern (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/763,414

(22) PCT Filed: Sep. 13, 1999

(86) PCT No.: PCT/GB99/03040

§ 371 (c)(1),
(2), (4) Date: Feb. 22, 2001

(87) PCT Pub. No.: WO00/24052

PCT Pub. Date: Apr. 27, 2000

(30) Foreign Application Priority Data

Oct. 19, 1998 (GB) .............................................. 9822690

(51) Int. Cl.[7] .............................................. C30B 25/16
(52) U.S. Cl. .......................... 117/85; 117/86; 118/715; 118/716
(58) Field of Search ..................... 117/85, 86; 118/715, 118/716

(56) References Cited

U.S. PATENT DOCUMENTS

| | | | |
|---|---|---|---|
| 5,091,320 A | 2/1992 | Aspnes et al. | |
| 5,461,559 A | 10/1995 | Heyob et al. | |
| 5,479,340 A | 12/1995 | Fox et al. | |
| 5,666,200 A | 9/1997 | Drevillon et al. | |
| 5,711,843 A | 1/1998 | Jahns | |
| 5,756,375 A | 5/1998 | Celii et al. | |

FOREIGN PATENT DOCUMENTS

EP 0 631 304 12/1994

OTHER PUBLICATIONS

Rao et al, "Monitoring VLSIC Fabrication Processes: A Bayesian Approach", IEEE Semi advanced Semiconductor Manufacturing Confernece, 1995 223–228.*

Niu et al., "A Bayesian Approach to Variable Screening for Modeling the IC Fabrication Process", IEEE Symposium on Circuits and Systems vol2., no 3. Pp. 1227–1230 1995.*

Sachs E et al.: "Run by run process control: combining SPC and feedback control" IEEE Transactions on Semiconductor Manufacturing, Feb. 1995, USA, vol. 8, No. 1, Feb. 1995, pp. 26–43.

Johs B et al.: "Real–time monitoring and control of epitaxial semiconductor growth in a production environment by in situ spectroscopic ellipsometry" Thin Solid Films, CH, Elsevier–Sequoia S.A. Lausanne, vol. 313–314, 1998, pp. 490–495.

Barradas N P et al.: "Bayesian inference analysis of ellipsometry data" Physical Review E (Statistical Physics, Plasmas, Fluids, and Related Interdisciplinary Topics), May 1999, APS Through AIP, USA, vol. 59, No. 5, pp. 6138–6151.

* cited by examiner

Primary Examiner—Robert Kunemund
(74) Attorney, Agent, or Firm—Nixon & Vanderhye P.C.

(57) ABSTRACT

Layer processing to grow a layer structure upon a substrate surface comprises supplying a vapor mixture stream to the substrate (28) to deposit constituents, monitoring growth with an ellipsometer (12) and using its output in real-time growth control of successive pseudo-layers. A Bayesian algorithm is used to predict a probability density function for pseudo-layer growth parameters from initial surface composition, growth conditions and associated growth probabilities therewith, the function comprising discrete samples. Weights are assigned to the samples representing occurrence likelihoods based on most recent sensor output. A subset of the samples is chosen with selection likelihood weighted in favor of samples with greater weights. The subset provides a subsequent predicted probability density function and associated pseudo-layer growth parameters for growth control, and becomes a predicted probability density function for a further iteration of pseudo-layer growth.

15 Claims, 7 Drawing Sheets

LAYER PROCESSING

BACKGROUND OF THE INVENTION

1. Field of the Invention

This invention relates to layer processing and to a method and a system therefor, and more particularly (although not exclusively) to such a method and system for processing semiconductor material layers.

2. Discussion of Prior Art

In techniques for processing materials in thin layers inter alia for integrated circuits, there is a well-known problem of controlling linear dimensions (eg layer thickness or etch depth) and chemical composition in real time, ie during growth of a layer or while etching a surface. This problem is particularly relevant to growing layers of materials by low pressure vapour phase epitaxy (LPVPE). A degree of control over growth is available by controlling the relative proportions of partial pressures of constituent gases in a LPVPE source gas stream to be decomposed to produce a deposited layer. The prearranged sequence of gas mixtures, substrate temperatures and growth times is included in a growth recipe, the proportions of which should at least approximately be preserved in a layer grown from it. However, in practice there is drift in the calibration of gas flow control apparatus, which means growth diverges from the prearranged recipe, and the composition of a growing layer can alter unless there is some means for monitoring and controlling the layer composition and thickness in real time. Unfortunately it is not possible to make direct measurements of the parameters of layer thickness and chemical composition in real time during growth. To do so it is necessary to interrupt growth of a specimen and remove it from growth apparatus, which is most unattractive because it is time consuming, it interrupts the growth process and it may contaminate the layer being grown.

As a partial and indirect approach to solving the problem of monitoring chemical composition and linear dimensions in real time, it is known to use spectroscopic ellipsometry. Ellipsometry can be used for measurements on a growing specimen or a specimen being etched, but it does not give the necessary composition and thickness information directly. It uses reflection of light from a specimen surface to give optical parameters, but these involve a convolution of dimensions and refractive index which cannot be separated. This problem occurs in the growth of alloys such as silicon germanium alloy ($Si_{1-x}Ge_x$), where it is important to have accurate control over the alloy composition parameter x as well as layer thickness. It is particularly important in the growth of superlattices where the composition parameter x in a material system such as $Si_{1-x}Ge_x$ alternates between successive layers in the region of eg 100 Angstroms thick.

However, it is possible to infer dimensions and composition from ellipsometric measurements combined with information from the chemical process taking place, eg a model of the process of a material being etched or of LPVPE layer growth derived from the gas mixture recipe. This again leads to further difficulties in practice because successive ellipsometric measurements taken at time intervals in the region of 1 or 2 seconds may be inaccurate or "noisy", and do not necessarily give acceptable results for layer process control except under favourable circumstances.

In Appl. Phys. Lett. 57 (25), December 1990, Aspnes et al described optical control of growth of $Al_xGa_{1-x}As$ by organometallic molecular beam epitaxy. They disclosed a closed-loop control system for epitaxial growth of a homogeneous semiconductor crystal using monochromatic ellipsometry. The system related to homogeneous growth of a single layer where composition was controlled to remain constant. There was no disclosure of control of layer thickness.

In Thin Solid Films, 220, 1992, Urban reported development of artificial neural networks for real time in-situ ellipsometry data reduction They described monochromatic ellipsometry for a single homogeneous layer grown upon a substrate. The neural network was trained to provide seed values for an iterative model fitting routine which fit the layer composition and thickness parameters to the measured ellipsometric angles. There was no disclosure of using the resulting estimate to control growth.

In Thin Solid Films, 223, 1993, Johs et al describe using multi-wavelength ellipsometry for real-time monitoring and control during growth of CdTe by metal-organic vapour phase epitaxy (MOVPE). They disclosed making ellipsometry measurements at twelve wavelengths in less than three seconds. They introduced the virtual-interface method for determining the characteristics of the near-surface region of the growing crystal. They wished to estimate the rate of growth of homogeneous material (constant composition). The estimates of near-surface layer composition were obtained by fitting the parameters of the virtual-interface model (dielectric constants and layer depth) using an iterative model fitting algorithm. This relied upon using the algorithm to fit layer composition parameters to the most recent ellipsometry measurements.

In Applied Surface Science 63 (1993) pp 9–16, Duncan and Henck describe an etching process using a specimen with a known refractive index; ellipsometric measurements then gave thickness or etch depth directly. The specimen was $SiO_2$ 2000 Angstroms thick upon an Si substrate. The etch depth measurements had uncertainties in the range 3 to 23 Angstroms. Measurements were made every 2 seconds approximately, and about 100 seconds were needed to etch through the specimen, so the incremental etch depth between measurements was 40 Angstroms. In consequence the uncertainty in the incremental etch depth varied between 15% and 57%, despite the $SiO_2$/Si system being favourable for ellipsometric measurements; these materials have very different refractive indices of 1.4 and 3.9 respectively at 2 eV, and they are therefore easily discriminated by optical measurements.

In layer growth processing of compounds, eg alloys such as $Si_{1-x}Ge_x$, it is desirable to determine the thickness and composition of the layer contribution grown between successive pairs of ellipsometric measurements at intervals of 1–2 seconds. $Si_{1-x}Ge_x$ is grown at a rate of about 1 Angstrom per second, so layer contributions are 1–2 Angstroms thick. Since the composition of the layer contribution is unknown so also is the refractive index, and therefore the thickness cannot be determined directly. Si and Ge have similar refractive indices, eg 3.9 and 4 at 2 eV, and consequently the refractive index of $Si_{1-x}Ge_x$ is not very sensitive to changes in x and ellipsometric measurements give more inaccurate results than those for the $SiO_2$/Si system.

In Diagnostic Techniques for Semiconductor Materials Processing II, Pang et. al. Eds, pp 87–94, Materials Research Soc., Pittsburgh, Pa. 1996, Vincent et. al. presented a method for in-situ estimation of etch rate using an extended Kalman filter based method for multi-wavelength reflectometry. Its possible application in real-time control was referred to but implementation details were not disclosed.

In the International Conference on Characterisation and Metrology for VLSI Technology, Gaithersburg, Md. USA, March 1998, Pickering et al disclose real-time process control using spectroscopic ellipsometry for Si/SiGe epitaxy. $Si_{1-x}Ge_x$ was grown with x in the range 0 to 0.2—ie variable composition. They discussed the composition/growth rate correlation problem required for control of very thin near-surface layers. It was suggested that a principal component analysis algorithm might be used to obtain an estimate of growth rate which is independent of alloy composition. Moreover an analysis of composition based on an artificial neural network algorithm was given which was compared with SIMS data; after adjustment by scaling to allow for the lack of growth rate data given by this approach, a discrepancy of 0.02 for x in the range 0 to 0.2 was obtained, ie an error of at least 10% even when scaled.

SUMMARY OF THE INVENTION

It is an object of the invention to provide an alternative method and apparatus for layer processing.

The present invention provides a method of layer processing comprising applying material to a surface to etch it or produce growth upon it, monitoring the surface with a sensor to provide an output indicating change therein, and using the output in generating a control input for layer processing, characterised in that the control input is generated partly on the basis of the sensor output and partly on the basis of change prediction from surface state prior to the change and processing conditions responsible for it.

The invention has the advantage that it does not rely on a potentially inaccurate or noisy sensor output as the only determinant of control. Instead it incorporates prediction based on prior surface and processing, which has the effect of counteracting sensor measurement uncertainty.

The control input is preferably generated in accordance with a Bayesian algorithm taking into account change probability based on prior surface state and material supply.

In a preferred embodiment, the method of the invention comprises growing a layer structure upon a heated substrate surface, comprising supplying a vapour mixture stream to the substrate for decomposition of stream constituents and selective deposition, monitoring growth upon the surface with an ellipsometric sensor providing an output in response, and using sensor output in controlling growth, characterised in that the method includes controlling growth partly on the basis of the sensor output and partly on the basis of change prediction from surface growth status prior to the change and stream constituents and substrate temperature responsible for it. A Bayesian algorithm may be employed in control of growth modelled as deposition of successive pseudo-layers upon the substrate to provide for the prediction of the composition and thickness parameters of a subsequent pseudo-layer on the basis of the stream constituents and substrate temperature during its growth and the composition of the respective preceding pseudo-layer.

The method of the invention may include growing successive pseudo-layers upon the substrate surface, together with the following steps undertaken during growth:

a) deriving a predicted probability density function for pseudo-layer growth parameters from initial surface composition, growth conditions and growth probabilities associated therewith, the function comprising discrete samples;

b) assigning weight values to the discrete samples in accordance with respective occurrence likelihoods derived on the basis of most recent sensor output;

c) selecting a subset of the discrete samples, selection likelihood being weighted in favour of samples with greater weight values;

d) using the subset to provide a subsequent predicted probability density function and controlling growth in accordance with the pseudo-layer growth parameters indicated thereby, e) iterating steps (b) to (e) until growth is complete.

In an alternative aspect, the present invention provides an apparatus for layer processing comprising means for applying material to a surface to etch it or produce growth upon it, the apparatus having predetermined processing characteristics in terms of material supply and surface condition, a sensor for monitoring the surface to provide an output indicating change therein, and control means for layer processing control responsive to the sensor output, characterised in that the control means is operative partly on the basis of the sensor output and partly on the basis of change prediction from surface state prior to the change and processing conditions responsible for it. The control input may be generated in accordance with a Bayesian algorithm taking into account change probability based on prior surface state and material supply.

The apparatus may be arranged to grow a layer structure upon a heated substrate surface, and comprise means for supplying a vapour mixture stream to the substrate for decomposition of stream constituents and selective deposition, an ellipsometric sensor for monitoring growth upon the surface and providing an output in response, and growth control means responsive to the sensor output, characterised in that the growth control means is operative partly on the basis of the sensor output and partly on the basis of change prediction from surface growth status prior to the change and stream constituents and substrate temperature responsible for it. The growth control means may employ a Bayesian algorithm in control of growth modelled as deposition of successive pseudo-layers upon the substrate surface, and provide for the prediction of the composition and thickness parameters of a subsequent pseudo-layer on the basis of the stream constituents and substrate temperature during its growth and the composition of the respective preceding pseudo-layer.

The apparatus may be arranged to grow successive pseudo-layers upon the substrate surface, and the growth control means is arranged to carry out the following steps undertaken during growth:

a) derive a predicted probability density function for pseudo-layer growth parameters from initial surface composition, growth conditions and growth probabilities associated therewith, the function comprising discrete samples;

b) assign weight values to the discrete samples in accordance with respective occurrence likelihoods derived on the basis of most recent sensor output;

c) select a subset of the discrete samples, selection likelihood being weighted in favour of samples with greater weight values;

d) use the subset to provide a subsequent predicted probability density function and controlling growth in accordance with the pseudo-layer growth parameters indicated thereby, e) iterate steps (b) to (e) until growth is complete.

BRIEF DESCRIPTION OF THE DRAWINGS

In order that the invention might be more fully understood, an embodiment thereof will now be described, by way of example only, with reference to the accompanying drawings, in which.

DETAILED DISCUSSION OF EMBODIMENTS

Figure 1:
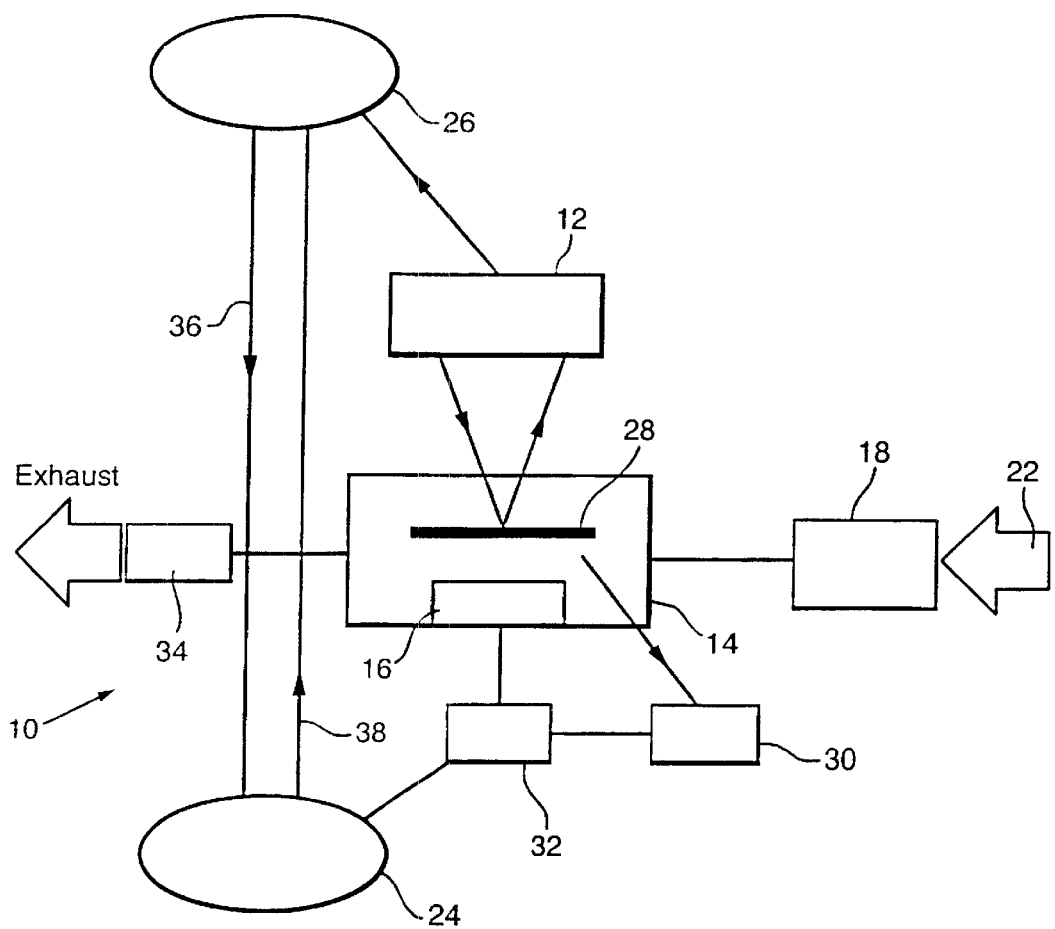
FIG. 1 is a schematic block diagram of a LPVPE system arranged to implement the invention.

Referring to FIG. 1, there is shown a low pressure vapour phase epitaxy (LPVPE) system indicated generally by 10, this being a reactor type no. CV4000 manufactured by Vacuum Generators Ltd modified by the addition of a spectroscopic ellipsometer 12 manufactured by SOPRA, a French company. It has a reaction chamber 14 to which the ellipsometer 12 is attached; the chamber 14 includes a radiant heater 16 and is connected via a gas control system 18 to a supply of source gases as indicated by an arrow 22. The heater 16 and gas control system 18 are controlled by a growth control computer 24, and the ellipsometer 12 is controlled by a further computer 26. A specimen wafer 28 is positioned on the heater 16 and its temperature is monitored by a pyrometer 30 supplying an output signal to a control unit 32 connected to the heater 16. The temperature of the wafer 28 is controlled in a closed loop using a Eurotherm 820 temperature controller (not shown) connected to the pyrometer 30. The growth control computer 24 sets wafer temperature by inputting data to the heater control unit 32. The reaction chamber 14 is connected to exhaust pumps 34. The computers 24 and 26 communicate with one another by links 36 and 38 as indicated by arrows thereon.

The gas control system 18 incorporates pneumatically actuated valves, mass flow controllers and a mixing manifold. The valves are operated by electronic driver circuits and pneumatic pilot valves. The mixing manifold is connected through valves and a mass flow controller to a source of hydrogen carrier gas for the active gas mixtures and to purge the manifold when the gas composition is changed. Gas mixtures are set up using a vent/run technique in which individual gas flows are adjusted and allowed to reach equilibrium with the gases flowing to exhaust before switching the mixture to the reaction chamber 14. Gas flow is controlled by the mass flow controllers in response to analogue input voltages derived by digital to analogue conversion of digital signals from the growth control computer 24. Balance hydrogen can also be admitted directly into the reaction chamber 14 through a separate mass flow controller to maintain a gaseous ambient when the gas mixture from the mixing manifold is switched to exhaust.

Growth control by the computer 24 is achieved by selecting or deselecting the electronic driver circuits to switch the gas mixture to the reaction chamber 14.

During low pressure vapour phase epitaxy (LPVPE) growth, the wafer 28 is heated to a temperature in the range 600–900 C. A mixture of source gases appropriate to the required layer composition is admitted to the reaction chamber 14 by the gas control system 18. Silicon (Si) and silicon-germanium (SiGe) alloys are grown using silane ($SiH_4$) and silane/germane ($GeH_4$) mixtures respectively in hydrogen carrier gas. P type and n type dopants may be introduced by adding gases such as diborane ($B_2H_6$) and arsine ($AsH_3$). The gas mixture flows over the heated wafer 28 and is pumped to exhaust by the pumps 34. Molecules in the gas mixture impinge on the hot wafer surface and decompose to produce atoms which are incorporated in a layer growing on the wafer 28. Volatile constituents are driven off.

During growth of a multilayer structure the substrate temperature is adjusted for each layer. When the substrate temperature is at the required value, growth is initiated by switching the gas mixture into the reaction chamber. At the end of the growth time the gas mixture is switched to exhaust and hydrogen is switched into the chamber.

As each layer is growing, the layer composition and thickness is estimated by the SE computer 26 partly from spectroscopic ellipsometry measurements, and partly using what is referred to for the purposes of this specification as a "particle filter tracking algorithm" to be described in more detail later. The algorithm incorporates into the estimation process experience of the growth process and the outcomes of changes in growth conditions. Ellipsometry measurements are made every 1.5 seconds. After each measurement the layer thickness and composition are estimated by the SE computer 26 and transmitted as input to the growth control computer 24. The growth control computer 24 periodically samples its input and reads any estimated thickness and composition data that have been received. The estimated thickness and composition are compared with those required, and when necessary the gas flows are adjusted to compensate for differences. Change in gas flow conditions are conmmunicated back to the SE computer 26 for use as prior knowledge in a subsequent iteration of the particle filter tracking algorithm involving the next ellipsometry measurements.

Figure 2:
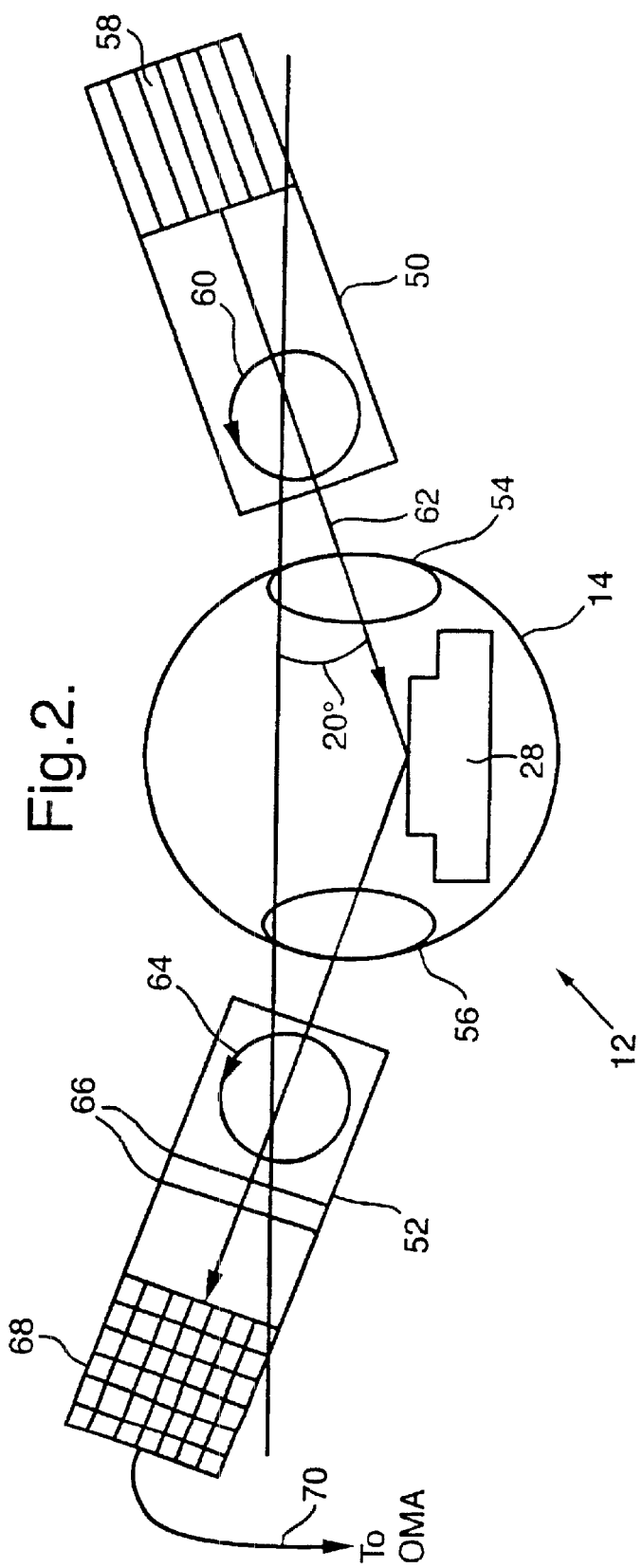
FIG. 2 is a vertical sectional view of the ellipsometer measuring apparatus used in the system of FIG. 1.

Referring now to FIG. 2, in which parts described earlier are like-referenced, the ellipsometer 12 is shown in more detail. It has polariser and analyser arms 50 and 52 aligned with respective quartz windows 54 and 56 in the reaction chamber 14. The polariser arm 50 has a broadband (white) light source 58 and a first polariser 60 which provide a linearly polarised beam 62 passing through one of the quartz windows 54 and incident on the surface of the wafer 28 within the chamber 14. This converts the beam to an a elliptically polarised state; it is reflected from the wafer 28 through the other quartz window 56 to the analyser arm 52, where it passes via a second polariser 64 and attenuators 66 to a light collection region 68 for input to an optical fibre 70 and transfer to an optical multichannel analyser (not shown).

The polarisers 60 and 64 can be rotated by motors (not shown), and the attenuators can be inserted or removed from the beam line by actuators (not shown). The two arms 50 and 52 are attached to an engineered mounting (not shown) and are inclined at approximately 20° to the horizontal ie to the wafer surface. This gives an angle of incidence of 70°. The polarisers 60 and 64 may be rotated continuously or sent to a specified angle and fixed there. During normal operation, the first polariser 60 is held fixed at 20° and the second polariser 64 is rotated continuously.

The optical multichannel analyser receives the light reflected from the growing sample and collected by the optical fibre 70. It consists of an intensified photodiode array plus associated digital signal processing electronics. The light from the optical fibre is passed through a prism, and the resulting spectrum is shone on to the photodiode array, a set of 512 UV sensitive photodiodes arranged in a line so that each diode receives a respective component of the light source spectrum. The signal processing electronics performs photodiode array read-out, as well as pre-processing the array signals into desired output signals.

The intensity I at each element of the photodiode array as a function of the analyser angle A(t) is given by $$I = I_0(1 + \eta\alpha\cos\{2[A(t)+A'(t)]\} + \eta\beta\sin\{2[A(t)+A'(t)]\}) \quad (1)$$

where $I_0$ is the average intensity, $\alpha$ and $\beta$ are Fourier coefficients and A'(t) and $\eta$ are phase factor and attenuation terms introduced by an initial analyser offset A' and non-ideal optical and electrical characteristics of the ellipsometer 12.

The signals are fed into the SE computer 26. The parameters of interest are the energy spectra of tan(ψ) and cos(Δ), which are, respectively, the amplitude ratio of the complex reflectance coefficients for electric field components polarised parallel ($r_p$) and perpendicular ($r_s$) to the plane of incidence, and the phase difference between those two components, i.e.

$$\tan(\psi) = \frac{|\tilde{r}_p|}{|\tilde{r}_s|} \text{ and } \Delta = (\theta_p - \theta_s) \qquad (2)$$

The SE computer 26 applies prior art ellipsometry data analysis algorithms to convert the measured intensity signal into the desired energy spectra of tan(ψ) and cos(Δ), as follows:

$$\cos(\Delta) = \left[\frac{\beta}{(1-\alpha^2)^{\frac{1}{2}}}\right] \qquad (3)$$

$$\tan(\psi) = \tan(P)\left[\frac{1+\alpha}{1-\alpha}\right]^{\frac{1}{2}} \qquad (4)$$

where P is the fixed polariser angle in the polariser arm 50.

In normal operation the SE computer 26 is configured to take a measurement from the photodiode array at fixed time intervals, every 1.5 seconds. These ellipsometric data are then processed by real-time analysis software which runs on the SE computer 26 concurrently with the ellipsometric processing software.

In the production of silicon germanium alloy, the SE computer 26 uses the analysis software to analyse its input data to deduce the germanium alloy fraction (x) and thickness (d) of the composite layer grown in the time since the last measurement. The input data comprise spectra of ellipsometric parameters [ψ, Δ] (or, equivalently) pseudo-dielectric constants with real and imaginary parts [e1, e2], together with the time of the measurement and the ellipsometer beam's angle of incidence on the wafer 28.

The SE computer 26 implements the prior art virtual interface/pseudo-substrate model to form the basis of a tracking algorithm to estimate germanium alloy fraction and layer thickness values in real-time. Growth on a semiconductor wafer substrate can be pictured as consisting of a series of very thin atomic films (pseudo-layers) being deposited one on top of the other to form a laminar structure. The expression pseudo-layers is used because they will not become true discrete layers with identifiable upper and lower surfaces. The growing composite is notionally divided up into a series of these pseudo-layers upon each of which the ellipsometer makes measurements of [tan(ψ), cos(Δ)] at regular intervals; each pseudo-layer is a respective region of growth produced between successive measurements.

The virtual-interface model represents the growing composite as three successive layers. When the (n+2)th measurement is made, the composite is treated as an uppermost layer of the reactor chamber atmosphere (approximated to vacuum), a central newly grown (n+1)th pseudo-layer, and a single lowermost layer incorporating all previous or 1st to nth pseudo-layers combined. The first measurement is made on the substrate before the first pseudo-layer is deposited. The lowermost layer is referred to as the pseudo-substrate, so-called because it is a series of n pseudo-layers of not necessarily equal alloy fractions but treated as a single layer.

This three layer approximation to the multi-layered composite is called the pseudo-composite. Strictly speaking, the uppermost of the three layers is not a layer at all, ie it is reactor atmosphere not grown or growing material; there are therefore only two layers of solid material in this structure.

The physics of each pseudo-layer is contained within the energy spectra of its dielectric constants, e1(E) and e2(E). The dielectric constants for the pseudo-substrate are determined from the previous measurement of the ellipsometric spectra. This enables the growing composite, which has grown between two successive measurements, to be presented as a two-layer structure (pseudo-substrate, with dielectric constants defined by the first measurement and newly-grown pseudo-layer, and ignoring the reactor atmosphere "layer"). The resulting measurement of ellipsometric spectra for any thickness and composition of pseudo-layer can then be modelled using reference spectra. Any two sets of measurements may be used; ie the procedure is not restricted to using pairs of successive measurements. If the pseudo-layer growth interval is that between pairs of non-successive measurements, increased pseudo-layer thickness is available for the current measurement/estimation process.

Figure 3:
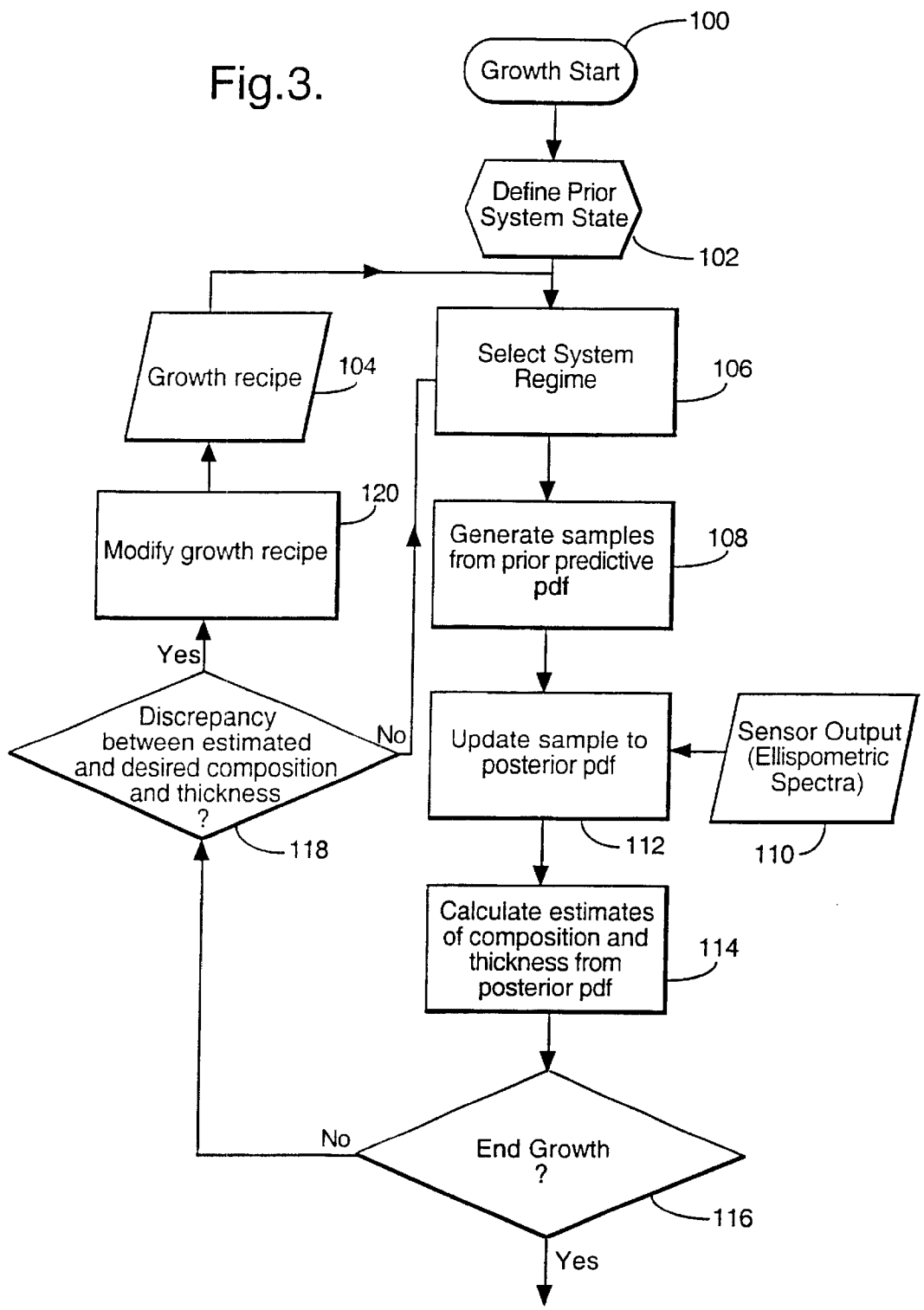
FIG. 3 is a flow diagram giving an overview of the procedure for controlling growth in the FIG. 1 system.

The growth process will now be described in more detail with reference to flow diagrams shown in FIGS. 3 to 7. FIG. 3 gives an overview of the process control algorithm, and parts shown as individual steps therein are shown in more detail in FIGS. 4 to 7.

In FIG. 3, the procedure for growth of silicon/germanium alloy ($Si_{1-x}Ge_x$) starts at a first step 100 with a substrate wafer 28 (upon which growth will take place) present in the reactor chamber 14. With prior knowledge of the substrate composition, the SE computer 26 defines a probability density function (pdf) which will be recalculated after each new pseudo-layer is produced. When growth is under way, this pdf represents the total available knowledge regarding the composition (alloy fraction x) and thickness (d) of the current (most recently grown) pseudo-layer. Before growth begins, and prior to making ellipsometric measurements of the system, the pdf is termed a prior pdf and represents a prediction (best estimate) of the alloy fraction and thickness of the first pseudo-layer which will later be grown on the wafer 28 when growth begins. In theory it would be possible to represent this pdf as a standard parametric form such as a Gaussian pdf or Gamma pdf. The true pdf of alloy fraction and thickness may not follow these parametric forms and representing them as such would restrict the tracking algorithm and become a source of error in the estimates of alloy fraction and thickness. A more flexible representation of this pdf is to approximate it by a cloud of N samples (ie a set of discrete data values) where each sample has an associated value of alloy fraction and thickness (x,d).

The growth control computer 24 holds a growth recipe 104 in memory, the recipe containing required gas flow rates, constituent gas concentrations wafer temperatures for producing the desired silicon/germanium structure. The structure comprises target values for the $Si_{1-x}Ge_x$ alloy fraction x and the required thickness d for the pseudolayer to be grown. The growth control computer 24 communicates the recipe to the SE computer 24, which defines the initial system regime at 106. The system regime defines the system evolution model, which is used to determine the prior predictive pdf of alloy fraction and layer thickness which will be obtained in the next pseudo-layer. This prior predictive pdf is derived from the prior pdf of alloy fraction and layer thickness by determining the action of the system evolution as modelled upon the prior pdf, ie it predicts samples (xpred,dpred) from prior samples (x,d) which approximate the prior pdf as aforesaid. While this is taking place, the new pseudo-layer is being grown, up to the point at which a new measurement is made by the layer sensor, ie the ellipsometer 12. This new measurement information— spectra of ellipsometric angles ($\psi,\Delta$)—regarding the alloy fraction and layer thickness is incorporated into the estimated likely alloy fraction and thickness by means of the measurement likelihood expression:

$$p(\psi,\Delta|x,d) \propto \exp[-0.5(\{\psi,\Delta\}-\{\psi,\Delta\}_s)^T S(\{\psi,\Delta\}-\{\psi,\Delta\}_s)] \quad (5)$$

where $\{\psi,\Delta\}_s$ is the predicted ellipsometric measurement obtained from a pseudo-layer with alloy fraction and thickness given by sample (x,d), the pseudo-layer being placed on top of a pseudo-substrate whose dielectric constants are derived from the immediately preceding ellipsometric measurement. S is the inverse covariance matrix associated with the measurement noise on the ellipsometric spectra. At 112, the SE computer calculates $p(\psi,\Delta|x,d)$, and, in accordance with Bayes' theorem, uses it to calculate a pdf for the posterior probability of alloy fraction and thickness of the sample pseudo-layer (x,d). This posterior pdf calculation incorporates the knowledge obtained by the most recent ellipsometric measurement with the knowledge obtained from all previous measurements and prior knowledge of the growth system regime dictated by the growth recipe. Details of this calculation will be described later.

At 114, the SE computer 26 uses the posterior pdf of layer alloy fraction and thickness (represented by a set of samples) to calculate point estimates (ergodic mean values) with associated confidence limits in the form of higher probability density regions. At 116, it passes these estimates and confidence measures to the growth control computer 24, which maintains a record in memory of all pseudo-layer thickness estimates obtained thus far during the present growth process, and sums them to obtain the current estimate of total pseudo-substrate thickness. If this estimate of total thickness is equal to the required thickness, the growth control computer 24 terminates the growth process and the wafer 28 is removed from the reaction chamber.

If the current estimate of total thickness is not equal to the required thickness, the growth control computer 24 starts a further iteration of the procedure by moving to step 118; here it uses the current calculated point estimates and associated confidence limits to estimate any discrepancy between the most recently determined or current layer alloy fraction and thickness and the alloy fraction and thickness desired at that particular point in the growth process (and as represented in the growth recipe). If there is no significant discrepancy, the growth control computer 24 communicates this to the SE computer 26, which responds by once more implementing (ie iterating) the selected system regime at 106 without modification.

If there is a discrepancy which has a significant confidence level associated with it, the growth control computer 24 counteracts it by producing at 120 an appropriate modification to the growth recipe at 104; this involves adjusting one or more of gas flow rate, concentrations of gas mixture constituents and wafer temperature to an appropriate extent to remove the discrepancy. The adjusted growth recipe defines the new system regime at 106 as before and the growth control process iterates once more. In this way growth control is achieved.

Figure 4:
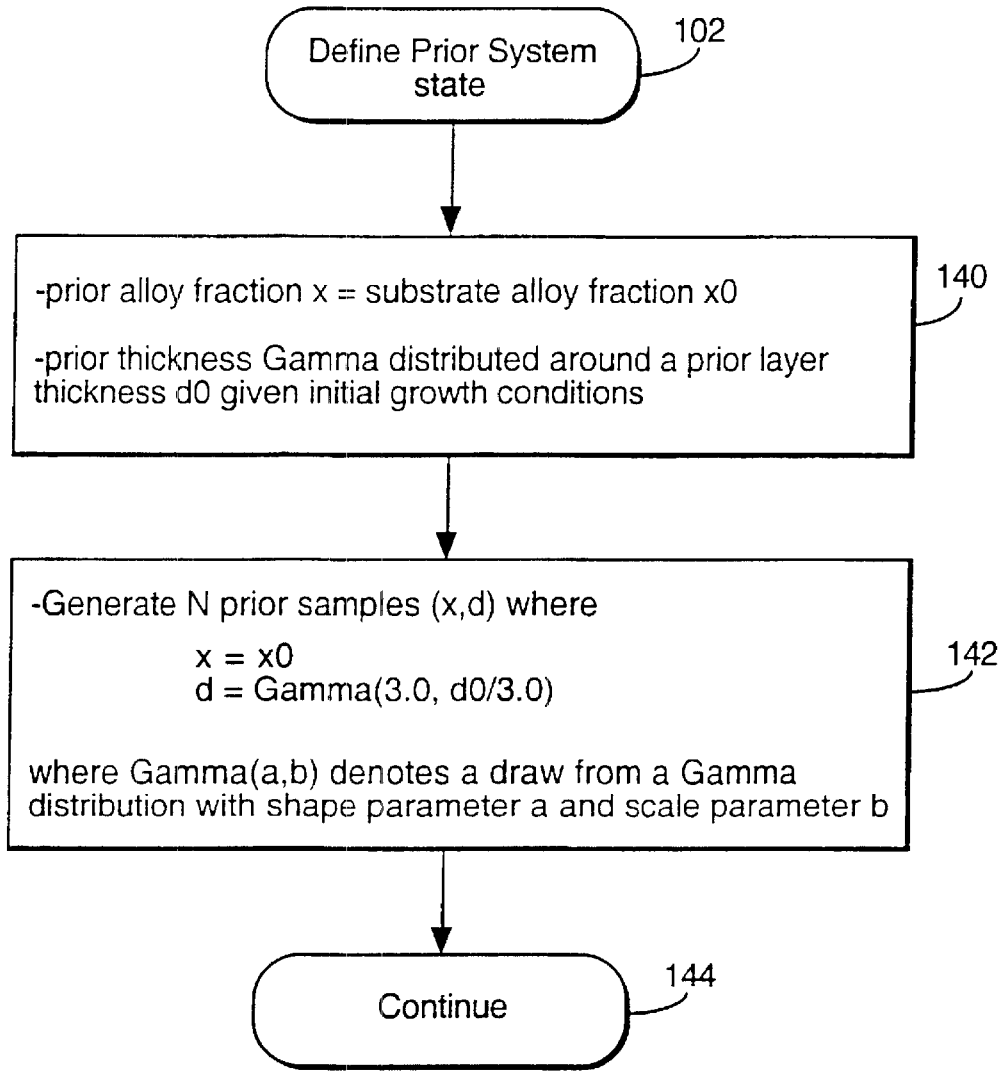
FIGS. 4 to 7 illustrate in more detail sections of the FIG. 3 procedure.

Stages in the growth control process will now be described in more detail. Referring to FIG. 4, where parts described earlier are like referenced, the procedure to define the prior system state at 102 in FIG. 3 is as follows. Initially the prior alloy fraction (x) is taken at 140 to be equal to that of the substrate wafer 28 upon which the new layer structure is to be grown, ie the original prior alloy fraction is (x0). The layer thickness is taken to have a pdf which is a Gamma distribution with shape parameter=3.0 and scale parameter= d0/3.0; here d0 represents the average pseudo-layer thickness expected to grow during the prearranged interval between ellipsometric measurements and average growth conditions (in the present example of silicon germanium growth d0=10 Angstroms) The pdf is generated at 142 as a set of N prior samples (x,d), where x=x0 and d is a random draw from the Gamma distribution specified above. The number of samples N may be anything from 10 to 10,000, 000; in the present example N=100. It is preferably as large as can be conveniently handled having regard to the computational power of the SE computer 24 and the sampling interval between successive ellipsometric measurements during which calculations are to be made as described earlier. If necessary the samping interval can be extended so that it is equal to a multiple of the time between successive ellipsometric measurements.

Figure 5:
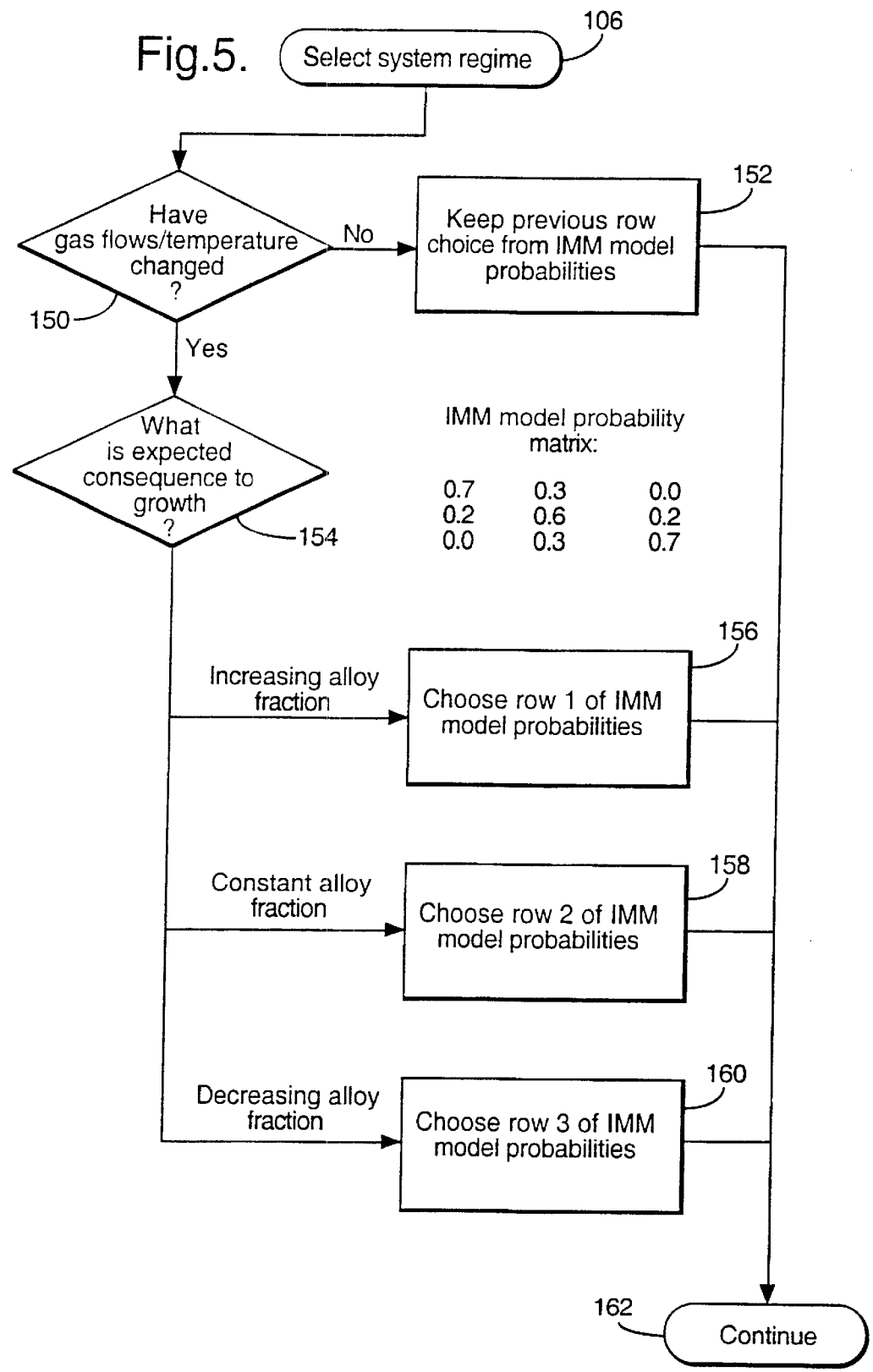

Having selected the prior samples, the SE computer 24 continues at 144 into the select system regime 106 shown in FIG. 5. This depends on the model of system evolution or material growth selected, which can be of any degree of complexity the SE computer 26 can accommodate in the time between measurements. In the present example a simple model with three distinct model regimes was appropriate, these being: (1) Alloy fraction increasing, (2) Alloy fraction remains relatively constant, and (3) Alloy fraction decreasing.

The evolution of the system representing growth of successive pseudo-layers is modelled as a random walk in terms of state parameters ie alloy fraction x and thickness d. That is, the value of x or d at time t ($x_t$ or $d_t$) is equal to its value at time t−1 ($x_{t-1}$ or $d_{t-1}$) plus a noise contribution ($v_x$ or $v_d$), where t and t−1 correspond to the times of successive ellipsometeric measurements, ie:

$$x_t = x_{t-1} + v_x \quad (6)$$

$$d_t = d_{t-1} + v_d \quad (7)$$

$v_x$ and $v_d$ are independent random noise factors; they represent the variability of the growth process determined from experience, ie that a particular prearranged recipe yields a variety of results because of random errors.

The different model regimes were treated by an interacting multiple model (IMM) with each regime having a slightly different noise model, ie:

(1) Increasing alloy fraction $v_x \sim \Gamma(2.0, 0.004)$, $v_d \sim \Gamma(2.0, 1.0)$.

(2) Constant alloy fraction $v_x \sim N(0.0, 0.005)$, $v_d \sim N(0.0, 1.0)$.

(3) Decreasing alloy fraction $-v_x \sim \Gamma(2.0, 0.004)$, $-v_d \sim \Gamma(2.0, 1.0)$.

Where "~" means distributed as; $\Gamma(\alpha, \beta)$ represents a gamma distribution with shape parameter $\alpha$ and scale parameter $\beta$; and $N(\alpha, \sigma)$ represents a normal distribution with mean value a and standard deviation $\sigma$; ie:

$$\Gamma(\alpha, \beta) = x^{\alpha-1} e^{-x/\beta} / [\beta^\alpha \Gamma(\alpha)] \text{ for } x > 0 \quad (8)$$

where $\Gamma(\alpha)$ is the gamma function given by:

$$\Gamma(\alpha) = \int_0^\infty e^{-t} t^{\alpha-1} dt \quad (9)$$

$$N(\alpha, \sigma) = \frac{1}{\sigma\sqrt{2\pi}} e^{-(x-\alpha)^2/2\sigma^2} \quad (10)$$

The model has three distinct elements. The probability that a model $k_t$ will follow a model $k_{t-1}$ is expressed by a model probability $p(k_t|k_{t-1})$, which can be represented as a matrix referred to as the interacting multiple model probability (IMMP) matrix K given by:

|  |  | $k_t$ |  |
|---|---|---|---|
| K | 1 | 2 | 3 |
| $k_{t-1}$ 1 | 0.7 | 0.3 | 0.0 |
| 2 | 0.2 | 0.6 | 0.2 |
| 3 | 0.0 | 0.3 | 0.7 | eg if the previous model was $k_{t-1}=1$ (increasing alloy fraction) corresponding to the uppermost row of the above matrix, then there is a 70% chance that the current model $k_t$ is also increasing alloy fraction, a 30% chance that it is constant and a 0% chance that it is decreasing. In this case the model probabilities have been defined using prior knowledge or expectations regarding the growth behaviour of the silicon/germanium material system, because information on the effects of changes to the growth conditions is available from experience of using the system 10. If the prior knowledge regarding this behaviour changes (eg if gas flow/composition has been changed), these probabilities are changed. Alternatively, they may be incorporated as parameters in the model and their values "learned" from the observations.

This model flexibility may be used to incorporate prior knowledge regarding gas flows etc. For example, if the flow of $GeH_4$ has been reduced then alloy fraction would be expected to fall and the model probabilities $p(k_t|k_{t-1})$ would be directly modified to reflect this.

An additional feature arising from the use of multiple models is that at any given time during growth one or more of the models will indicate a high probability that the growth is following the regime represented by that model. A measure of the quality of growth may be gained by monitoring the regime that currently has a high probability and comparing this with the expected regime. For example, if the gas flow rates and proportions are expected to lead to a growth regime where alloy fraction will increase, but the model with highest probability is that for constant alloy fraction, this would indicate that the growth quality is not optimum and the growth apparatus may be contaminated.

The SE computer 26 determines at 150 whether or not the growth conditions (gas flows/constituent concentrations, wafer temperature) have to be changed. A change in the recipe can either arise from a dictated change presented in the recipe at 104 or from a required change in the recipe at 120 due to a discrepancy between the measured and desired x and d profiles. When the SE computer 26 has been using a row of the above IMMP matrix K for the growth conditions of the nth pseudo-layer, and no change is determined at 150 for the growth conditions of the (n+1)th pseudo-layer, the SE computer 26 continues to use that row. If a change is determined at 150 for these latest growth conditions, the impact of the change upon the growth conditions is determined at 154 from prior knowledge or experience of the behaviour of the system 10 as a function of growth conditions. This knowledge is stored in the SE computer 26 in the form of a look-up table of growth condition parameters and corresponding pseudo-layer composition. For a regime where alloy fraction is expected to be increasing, the first (uppermost) row of the matrix K is selected at 156. If alloy fraction is expected to remain constant, the second (middle) matrix row is selected at 158. If alloy fraction is expected to be decreasing, the third matrix row is chosen at 160. The SE computer 26 then continues at 162 with the next step in the procedure, which is generating prior predictive samples at 108.

Figure 6:
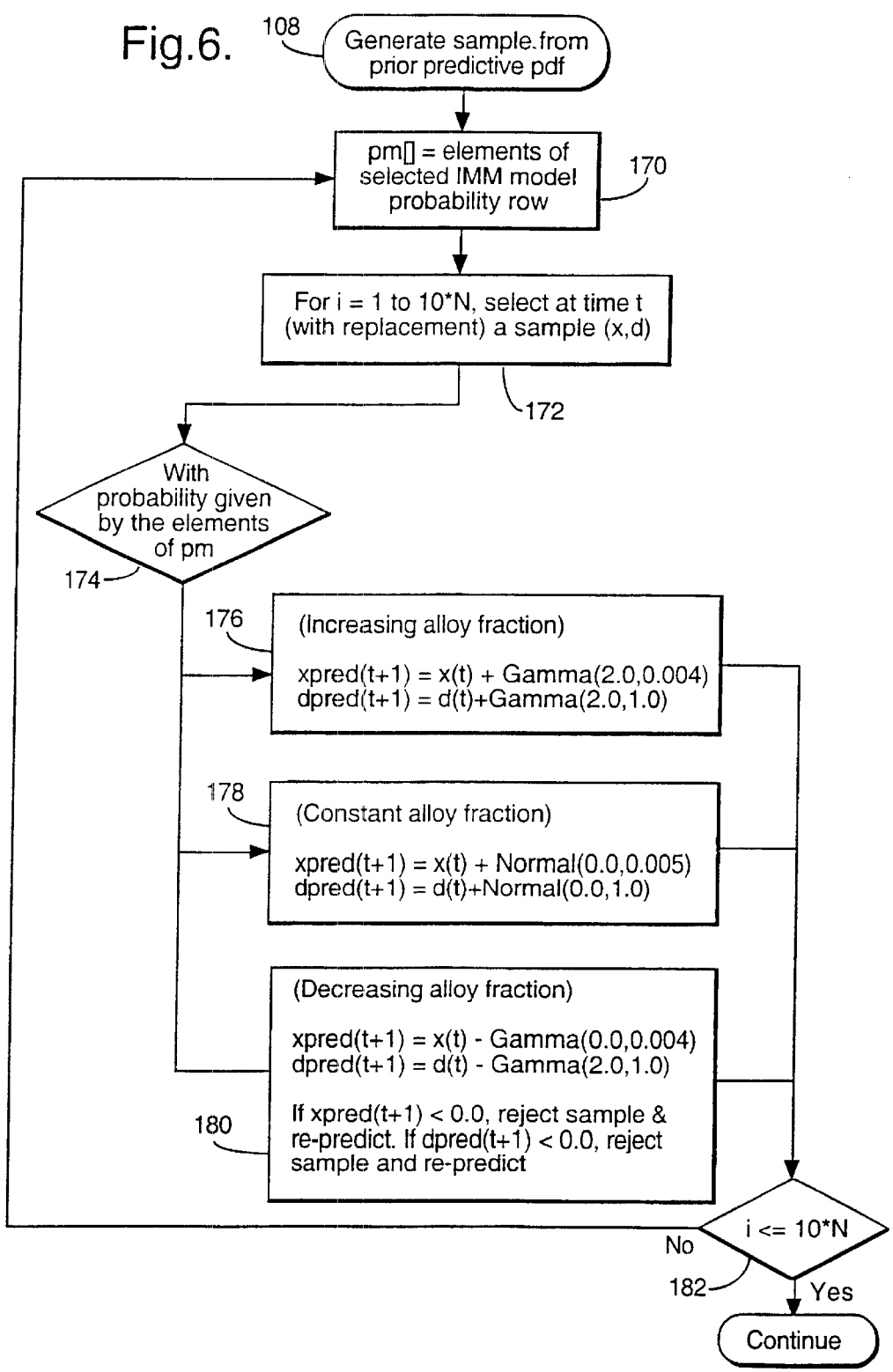

Referring now to FIG. 6, generation of prior predictive samples at 108 begins at 170, where the elements of the selected row of the matrix K indicated by the current growth conditions are used by the SE computer 26 as the vector probability model (pm) it employs; the pm comprises the probability pm(1) of the increasing alloy fraction model, the probability pm(2) of the constant alloy fraction model and the probability pm(3) of the decreasing alloy fraction model.

The SE computer 26 selects at random one of the N prior samples of (x,d) at 172 and puts it through the random walk calculation expressed by Equations (6) to (10) and IMMP matrix K; ie at 174 it selects one of the system models 176 (increasing alloy fraction), 178 (constant alloy fraction) or 180 (decreasing alloy fraction) in accordance with the probability pm(1) pm(2) or pm(3) chosen at 174. The values of x and d associated with the selected sample are passed through the chosen system evolution model to yield new values of x (xpred) and d (dpred) which are associated with a single prior predictive sample (xpred,dpred). This procedure is carried out 1000 times (for the chosen value of N=100) to yield 10N prior predictive samples (xpred,dpred). In the drawing, the asterisk in 10*N merely implies "multiplied by". Iteration count is determined at 182, and if not complete the SE computer 26 returns to 172; otherwise it moves on to the update samples step at 112.

Figure 7:
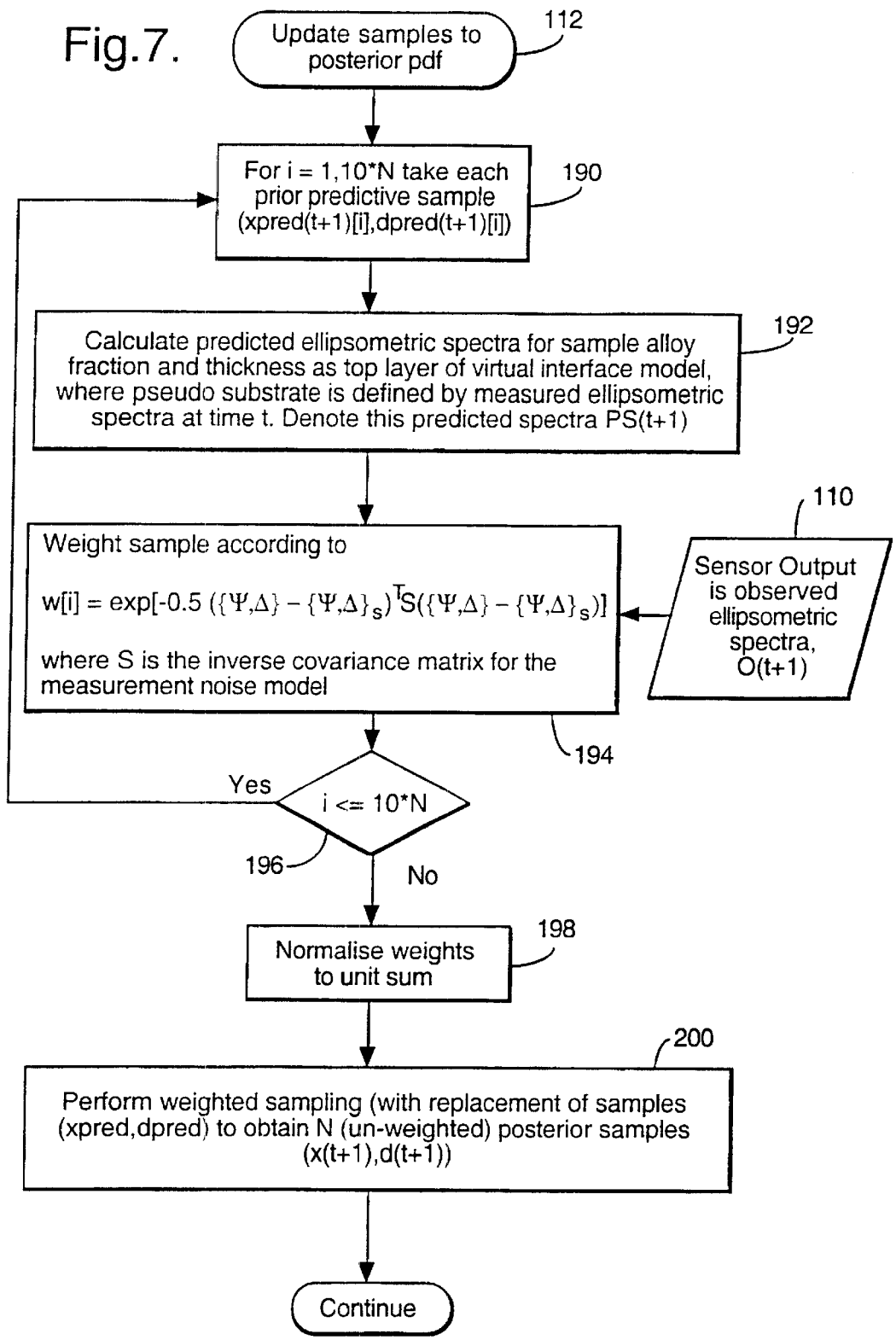

Referring now to FIG. 7, there is shown the step 112 of updating prior predictive samples to posterior samples in more detail. The SE computer 26 takes each of the ION prior predictive samples in turn at 190, and at 192 calculates a predicted sensor (ellipsometer) measurement $\{\psi,\Delta\}_s$ from it using the virtual interface model; here the uppermost pseudo-layer alloy fraction and thickness is taken to be the values associated with this sample (xpred,dpred) and the pseudo-substrate dielectric constants are defined by the sensor measurement on the preceding iteration. The SE computer 26 uses this predicted measurement at 194 to calculate the likelihood of the most recent (current) sensor output from 110 given the sample state (xpred,dpred). The chosen sample is then assigned a weight w[i] which is equal to this likelihood value given by the right hand side of the maximum likelihood expression at (5) above, ie:

$$w[i] = \exp[-0.5(\{\psi,\Delta\}-\{\psi,\Delta\}_s)^T S(\{\psi,\Delta\}-\{\psi,\Delta\}_s)] \quad (11)$$

The SE computer 26 repeats this for all 10N prior predictive samples by returning to 190 until the iteration count at 196 is complete.

When all prior predictive samples have been given a weight w[i], the SE computer 26 normalises the weights at 198 by calculating their total sum and dividing each of them by it so that they sum to unity. Next, at 200, it selects a sample randomly from the 10N prior predictive samples, but does so having regard to sample occurrence probability which is equal to the sample weight; to illustrate this with a simple example, if there were only three samples with respective normalised weights 0.2, 0.3 and 0.5, these would be assigned the intervals 0 to 0.2, 0.21 to 0.5 and 0.51 to 1, any value between 0.2 and 0.21 or 0.5 and 0.51 being rounded up. Thus interval length is proportional to weight. A random number generator selects a number between 0 and 1; the first, second or third sample is selected according to whether the random number appears in the first, second or third interval. Thus a sample of higher weight has a greater probability of being chosen. The SE computer 26 uses a similar procedure to select from the prior predictive samples except that there are 10N of these as has been said.

The chosen sample is copied to the posterior sample and the sample selection process is carried out a total N times, ie only one tenth of the prior predictive samples are chosen. Upon completion the selected samples are the set of posterior samples or discrete values; this set is an approximation to the posterior pdf representing alloy fraction and thickness and uncertainty therein for the latest pseudo-layer which has just grown in the time interval between the most recent or current measurement and the immediately preceding measurement. This pdf represents the total available knowledge regarding the currently growing silicon germanium alloy structure; it is used by the SE computer 26 to obtain point estimates of alloy fraction and layer depth for use by the growth control computer 24 to amend the growth recipe and hence control the alloy growth. In addition, these posterior samples become the prior samples for the next iteration of the procedure in which the next pseudo-layer is grown and the next ellipsometer measurement is made. Thus the algorithm proceeds cyclically until growth is terminated.

The control process described with reference to FIGS. 3 to 7 is based around a sequential Bayesian tracking algorithm which permits in-situ estimation of the state of the uppermost pseudo-layer of a growing semiconductor crystal structure. The algorithm is a flexible sample based method for implementing non-linear/non Gaussian state-space models. This enables in-situ real-time estimates of pseudo-layer composition and thickness grown since last measurement to be made for growing crystal structures with complex inhomogeneous composition profiles using multi-wavelength ellipsometric measurements. Its strength is that it incorporates knowledge of the growth process into the estimates of pseudo-layer composition and thickness, and does not rely entirely on sensor measurements which can be noisy and inaccurate.

Whereas the invention has been described in terms of pseudo-layers grown between two successive ellipsometer measurements, it may also be implemented using pseudo-layers grown over longer intervals, eg at intervals between every second or third successive ellipsometer measurement or longer. It may also be used in an etching process in which the refractive index and composition of the material to be etched are known, in which case only thickness—ie etch depth—need be determined.

What is claimed is:

1. A method of layer processing comprising using processing apparatus to apply material to a surface to etch it or produce growth upon it, monitoring the surface with a sensor providing an output indicating progress in processing the surface, and using the sensor output in generating a control input for controlling the surface's processing conditions, wherein the control input is generated in accordance with a Bayesian algorithm incorporating the following steps:
    a) prediction of a distribution of possible parameter values characterising change to the surface, the prediction being on the basis of processing conditions prearranged to produce the change and surface state prior to the change,
    b) weighting the distribution selectively in accordance with likelihood of the sensor output corresponding to surface states indicated by respective parameter values,
    c) using the weighted distribution to provide an updated estimate of surface state,
    d) iterating steps (a) to (c) until processing of the surface is complete.

2. A method according to claim 1 wherein step (c) comprises making a selection of a subset of the weighted distribution with selection probability influenced by the said likelihood.

3. A method according to claim 1 wherein step (b) includes calculating estimated values of sensor output which correspond to the possible parameter values predicted in step (a), and obtaining likelihood from estimated and actual sensor outputs.

4. A method according to claim 1 wherein prediction in step (a) involves random walk calculation beginning from a surface state prior to change.

5. A method according to claim 4 for producing growth of multiple material species upon the surface, wherein calculation is influenced by change in growth recipe and by relative probability of continuance and change in species growth.

6. A method of growing a layer structure upon a heated substrate surface, comprising supplying a vapour mixture stream to the substrate for decomposition of stream constituents and selective deposition, monitoring growth upon the surface with an ellipsometric sensor providing an output in response, and using sensor output in controlling growth, wherein the method includes controlling growth partly on the basis of the sensor output and partly on the basis of change prediction from surface growth status prior to the change and stream constituents and substrate temperature responsible for it, growth control being in accordance with a Bayesian algorithm and:
    a) models growth as deposition of successive pseudo-layers upon the substrate, and
    b) predicts composition and thickness parameters of a subsequent pseudo-layer on the basis of the stream constituents and substrate temperature during its growth and the composition of the respective preceding pseudo-layer.

7. A method of growing a layer structure upon a substrate surface comprising supplying a vapour mixture stream to the substrate for decomposition of stream constituents and selective deposition, monitoring growth upon the surface with an ellipsometric sensor providing an output in response, and using sensor output in controlling growth, wherein the method includes growing successive pseudo-layers upon the substrate surface, together with the following steps undertaken during growth:
    a) deriving a predicted probability density function for pseudo-layer growth parameters from initial surface composition, growth conditions and growth probabilities associated therewith, the function comprising discrete samples;
    b) assigning weight values to the discrete samples in accordance with respective occurrence likelihoods derived on the basis of most recent sensor output;
    c) selecting a subset of the discrete samples, selection likelihood being weighted in favour of samples with greater weight values;
    d) using the subset to provide a subsequent predicted probability density function and controlling growth in accordance with the pseudo-layer growth parameters indicated thereby,
    e) iterating steps (b) to (d) until growth is complete.

8. A method according to claim 1 further including the step of deriving an expected process model of growth or etching from an associated recipe based on processing materials and environmental conditions and comparing it with a process model of highest probability derived from a previously determined surface composition to provide an indication of quality of growth or of growth apparatus.

9. Apparatus for layer processing comprising means for applying material to a surface to etch it or produce growth upon it, the apparatus having predetermined processing characteristics in terms of material supply surface environment and surface processing, a sensor for monitoring the surface to provide an output indicating change therein, and control means for layer processing control responsive to the sensor output, wherein the control means is operative in accordance with a Bayesian algorithm to execute the following steps:
 a) prediction of a distribution of possible parameter values characterising change to the surface, the prediction being on the basis of processing conditions prearranged to produce the change and surface state prior to the change,
 b) weighting of the distribution selectively in accordance with likelihood of the sensor output corresponding to surface states indicated by respective parameter values,
 c) use of the weighted distribution to provide an updated estimate of surface state,
 d) iteration of steps (a) to (c) until processing of the surface is complete.

10. Apparatus according to claim 9 wherein step (c) comprises the making of a selection of a subset of the weighted distribution with selection probability influenced by the said likelihood.

11. Apparatus according to claim 9 wherein step (b) includes calculation of estimated values of sensor output which correspond to the possible parameter values predicted in step (a), and the obtaining of likelihood from estimated and actual sensor outputs.

12. Apparatus according to claim 9 wherein prediction in step (a) involves random walk calculation beginning from a surface state prior to change.

13. Apparatus according to claim 12 for producing growth of multiple material species upon the surface, wherein calculation is influenced by change in growth recipe and by relative probability of continuance and change in species growth.

14. Apparatus for growing a layer structure upon a heated substrate surface, comprising means for supplying a vapour mixture stream to the substrate for decomposition of stream constituents and selective deposition, an ellipsometric sensor for monitoring growth upon the surface and providing an output in response, and growth control means responsive to the sensor output, wherein the growth control means is operative partly on the basis of the sensor output and partly on the basis of a Bayesian algorithm in which control of growth is modelled as deposition of successive pseudo-layers upon the substrate surface, and provides for the prediction of the composition and thickness parameters of a subsequent pseudo-layer on the basis of the stream constituents and substrate temperature during its growth and the composition of the respective preceding pseudo-layer.

15. Apparatus for growing a layer structure upon a heated substrate surface, comprising means for supplying a vapour mixture stream to the substrate for decomposition of stream constituents and selective deposition, an ellipsometric sensor for monitoring growth upon the surface and providing an output in response, and growth control means responsive to the sensor output, wherein the apparatus is arranged to grow successive pseudo-layers upon the substrate surface, and the growth control means is arranged to carry out the following steps undertaken during growth:
 a) derive a predicted probability density function for pseudo-layer growth parameters from initial surface composition, growth conditions and growth probabilities associated therewith, the function comprising discrete samples;
 b) assign weight values to the discrete samples in accordance with respective occurrence likelihoods derived on the basis of most recent sensor output;
 c) select a subset of the discrete samples, selection likelihood being weighted in favour of samples with greater weight values;
 d) use the subset to provide a subsequent predicted probability density function and controlling growth in accordance with the pseudo-layer growth parameters indicated thereby,
 e) iterate steps (b) to (d) until growth is complete.

* * * * *